(12) United States Patent
Tanno (10) Patent No.: US 7,184,305 B2
(45) Date of Patent: Feb. 27, 2007

(54) NONVOLATILE SEMICONDUCTOR STORAGE DEVICE AND ROW-LINE SHORT DEFECT DETECTION METHOD

(75) Inventor: Shoichi Tanno, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 518 days.

(21) Appl. No.: 10/718,440

(22) Filed: Nov. 19, 2003

(65) Prior Publication Data

US 2004/0105327 A1    Jun. 3, 2004

(30) Foreign Application Priority Data

Nov. 28, 2002   (JP)   ............................. 2002-345214

(51) Int. Cl.
*G11C 16/06* (2006.01)

(52) U.S. Cl. ............. 365/185.09; 365/201; 365/185.23

(58) Field of Classification Search ........... 365/185.09, 365/201, 185.23

See application file for complete search history.

(56) References Cited

U.S. PATENT DOCUMENTS 6,654,290 B2 *  11/2003  Lee et al. .............. 365/185.23

FOREIGN PATENT DOCUMENTS

JP              7-192500         7/1995

* cited by examiner

*Primary Examiner*—David Lam
(74) *Attorney, Agent, or Firm*—Morrison & Foerster LLP (57) ABSTRACT

A current-path isolating circuit is provided in a row decoder circuit that selects a part of the plurality of row lines of a memory array and that selectively provides a selected row line with a voltage level different from that for other row lines. In a test mode different from a normal operation mode, the current-path isolating circuit isolates a current path in the device into a first current path for a current flowing through the row line selected and a second current path for a current not flowing through the row line but flowing through the row decoder circuit. The current path isolated is formed to supply a testing voltage to the selected row line from a testing voltage source.

8 Claims, 4 Drawing Sheets

NONVOLATILE SEMICONDUCTOR STORAGE DEVICE AND ROW-LINE SHORT DEFECT DETECTION METHOD

BACKGROUND OF THE INVENTION

1. Field of the Invention

The invention relates generally to a nonvolatile semiconductor storage device having a memory array configured such that a plurality of nonvolatile semiconductor memory cells capable of storing one-bit information or multi-bit information are individually arranged in a row direction and a column direction. The memory array has a plurality of row lines and a plurality of column lines that are arranged to enable selection of a predetermined memory cell or memory cells from the plurality of memory cells. More specifically, the invention relates to a nonvolatile semiconductor storage device having a row-line short detection function and to a row-line short defect detection method for detecting a row-line short defect in a nonvolatile semiconductor storage device.

2. Description of the Related Art

With recent rapid advances in the development of semiconductor integrated circuit technology, also in the field of nonvolatile semiconductor storage devices, the storage capacities thereof are increased through miniaturization and compact integration of memory cells. In line with the technological advancement, design rules for components, such as transistors and wires, to be used with the devices are made to be correspondingly fine. Conventionally, in the field of nonvolatile semiconductor storage devices, measurement is carried out to test row-line short defects, which is one type of memory cell defects. The types of such measurement include "leaky-row measurement" (which is performed to test the presence or absence of leakage between adjacent row lines).

Figure 4:
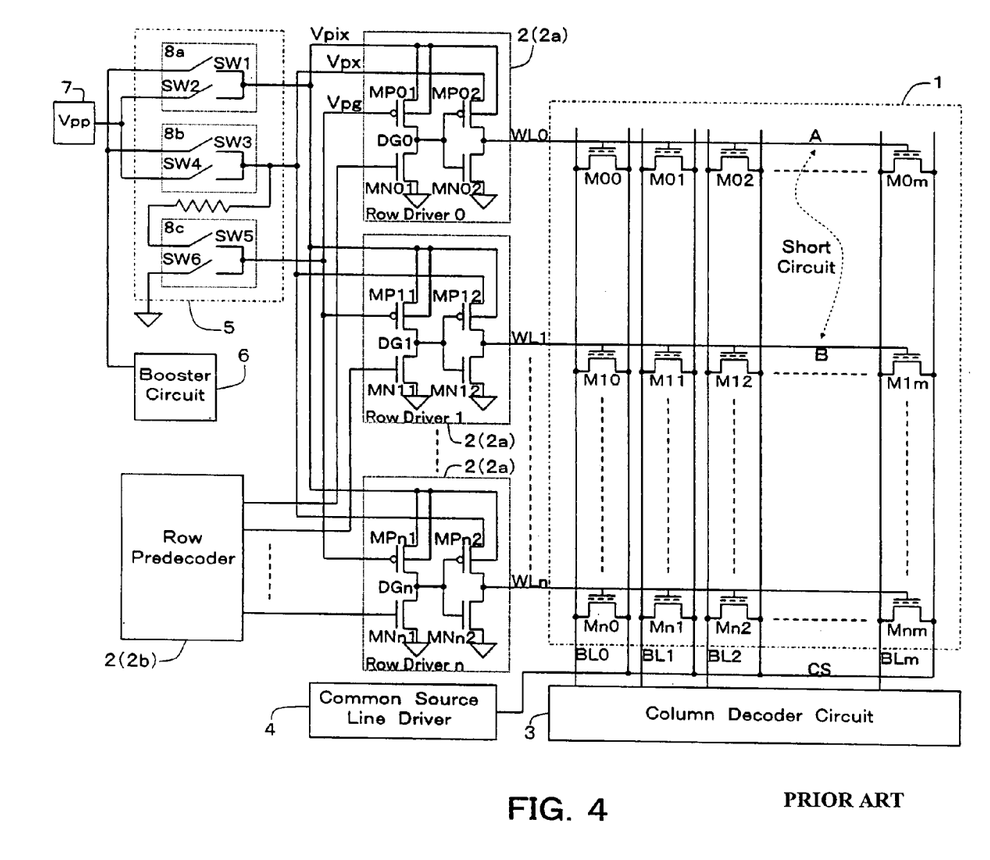
FIG. 4 is a circuit block diagram depicting an embodiment of a conventional (prior art) nonvolatile semiconductor storage device.

The leaky-row measurement will be described hereunder with reference to a conventional example shown FIG. 4. FIG. 4 depicts a conventional example a nonvolatile semiconductor storage device having a row-line short defect detection function.

Referring to FIG. 4, the nonvolatile semiconductor storage device has a memory array 1, a row decoder 2, a column decoder 3, a common source line driver 4, a mode switch circuit 5, a booster circuit 6, and an external connecting pad 7 that receives a testing voltage supplied from a testing voltage source. In addition, similar to a general-purpose semiconductor memory, the nonvolatile semiconductor storage device has peripheral circuits, such as an address input circuit, data input/output circuit, and a control signal input circuit. However, since the peripheral circuits are not directly related to explanation of the leaky-row measurement, the circuits are not shown in the drawing.

The configuration of the memory cell array 1 will be described hereunder. Memory cells, each of which is formed of a single floating gate MOSFET, for example, are arranged in the vertical and transverse directions in the form of an array. In the array, a plurality of row lines WL and a plurality of column lines BL are individually arranged in the transverse direction (row direction) and the vertical direction (column direction) to be used for selection of a predetermined memory cell or memory cells from the overall memory cells. Referring to FIG. 4, the plurality of row lines WL consist of n+1 row lines WL0 to WLn ("n" represents a non-negative integer) and are connected to control gates of individual memory cell transistors in the transverse direction (row direction), thereby enabling application of a predetermined voltage. In addition, in the configuration shown in FIG. 4, the plurality of column lines BL consist of m+1 column lines BL0 to BLm ("m" represents a non-negative integer) and are connected to the drains of the individual memory cell transistors, thereby enabling data transfer (such as reads or programs of data) from or to the individual memory cells. The sources of the individual memory cell transistors are commonly used, and hence the sources are connected to a common source line CS.

The row decoder 2 is formed to be capable of selecting at least one of the plurality of row lines WL0 to WLn and selectively setting the selected lines to a voltage level different from that set for others not selected. Row drivers 0 to n are connected to the individual row lines WL0 to WLn to individually function as row-line select circuits that supply drive voltages to the individual row lines WL0 to WLn. In the individual row drivers 0 to n, row predecoders are provided that individually decode input signals into selection/non-selection signals in accordance with address signals (not shown). The row drivers 0 to n and the row predecoders each cooperatively form a rearstage section 2a and a forestage section 2b.

In a flash memory, which is a typical or representative nonvolatile semiconductor storage device, a high voltage of 9V, for example, is applied thereto in a row-line selection mode for an operation such as a program (program operation). In the conventional example case, the booster circuit 6 (charge pump circuit) is built in the nonvolatile semiconductor storage device to cause intradevice charge pumping for a power supply voltage (of 3V or 5V, for example) of the storage device. A row driver i (i=any one of 0 to n) has a double-stage configuration with a driver stage (formed of transistors MPi2 and MNi2) and a predriver stage (formed of transistors MPi1 and MNi1). The former driver stage is used as a driver circuit that applies 9V to a row line WLi in a selection mode and that applies 0V to the row line WLi in the unselected state. The latter predriver stage drives the driver stage to accelerate access (to increase the selection/non-selection switching speed).

The column decoder 3 is connected to the individual column lines BL0 to BLm. The column decoder 3 includes, for example, a driver and a sense amplifier. The drive is used to apply predetermined voltages to the individual column lines BL0 to BLm in individual program and erase modes. The sense amplifier is used to detect the potentials of all or a selected number of column lines at a read mode. The common source line driver 4 is configured of a driver that applies predetermined voltages to the common source line CS in the individual program, erase, and read modes.

The mode switch circuit 5 is responsible to switch between two modes of applying voltages to a row driver selected by the corresponding row predecoder. One mode is to apply the selected row driver with a voltage that is output from the booster circuit 6 in a normal operation mode. The other mode is to apply the selected row driver with a testing voltage (Vpp) that is output from the external connecting pad 7 in a test mode. In the example configuration shown in FIG. 4, the mode switch circuit 5 is configured of three types of input selection circuits 8a to 8c, each of which is of a two-input/one-output type. The input selection circuits 8a to 8c are each configured of a pair of switching devices. In this configuration, a voltage applied by a mode switch signal to one of the two input terminals is supplied to the output terminal. In addition, in the configuration, the voltage to be applied to the two input terminals can be divided to supply an intermediate voltage to the output terminal.

The first input selection circuit 8a is responsible to switch the supply source of a voltage Vpix (the well (backgate) voltage of the transistor MPi2 of the row driver, and a well (backgate) voltage of the transistor MPi1) between the normal operation mode and the test mode. The second input selection circuit 8b is responsible to switch the supply source of a voltage Vpx (the source voltage of the transistor MPi2 of the row driver) between the normal operation mode and the test mode. The third input selection circuit 8c is responsible to switch the supply source of a voltage Vpg (the gate voltage of the transistor MPi1) between the normal operation mode and the test mode. However, the third input selection circuit 8c does not perform the simple operation of switching the voltage supply source between the normal operation mode and the test mode, but also performs the following operations. In the normal operation mode, the circuit 8c sets both the switching devices to the conductive state to enable the transistor MPi1 to be concurrently used as a pullup resistant component. Where, the voltage Vpg, which is lower than the voltage Vpx, is generated through resistance-type potential division, and the transistor MPi1 is driven to the on-state to boost an output node DGi of the predriver stage to the high voltage of 9V through the pullup resistant component. In the test mode, the circuit 8c fixes the voltage Vpg to the ground potential.

The individual switching devices of the individual input selection circuits 8a to 8c are operated as described hereunder. In the normal operation mode, switching devices SW1, SW3, SW5, and SW6 are set to the conductive state, and switching devices SW2 and SW4 are set to the nonconductive state. In the test mode, the switching devices SW2, SW4, and SW6 are set to the conductive state, and the switching devices SW1, SW3, and SW5 are set to the nonconductive state.

Figure 2:
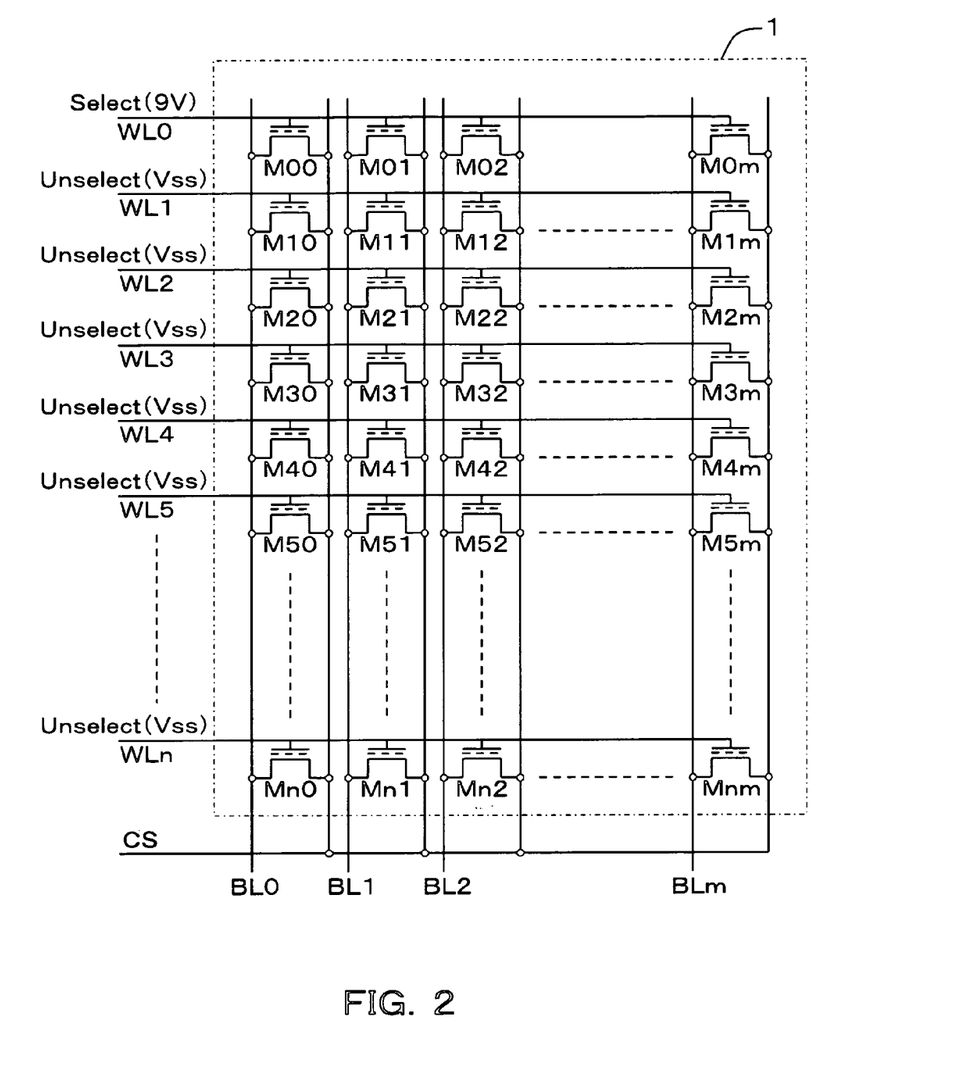
FIG. 2 is an explanatory view depicting a selected state of row lines of a memory array of the nonvolatile semiconductor storage device in a test mode.

A detection method for the presence or absence of leakage current between adjacent row lines will be described hereinbelow. In this method, a leakage current detected between adjacent row lines indicates occurrence of a short defect. In the test mode, the common source line CS and the individual column lines BL0 to BLm are grounded. Then, as described above, the mode switch circuit 5 sets the switching devices SW2, SW4, and SW6 to the conductive state, and sets the switching devices SW1, SW3, and SW5 to the nonconductive state. FIG. 2 shows a case where one row line (WL0) is selected from all the row lines WL0 to WLn of the memory array 1, and the test voltage Vpp (9V, for example) is applied from the external connecting pad 7. In this case, the method measures a current (Ipp) flowing through the pad 7. Then, the method sequentially selects the row lines, and measures the individual currents Ipp flowing through the external connecting pad 7. During the measurement, suppose that an inter-row-line short defect is detected at the portion between a node A on the row line WL0 and a node B on the row line WL1, shown in FIG. 4. In this case, a current path is formed from the external connecting pad 7 to Vss (ground potential) via the switching device SW4, transistors MP02, row lines WL0 and WL1, and transistor MN12, and a leakage current flows through the current path. As such, the portion of inter-row-line short defect can be detected by detection of the current Ipp.

However, since each of the transistors MP02 and MN01 of the predriver stage in the row driver corresponding to the selected row line is in the on-state in which a pass-through current is kept flowing therethrough, the measured current Ipp usually contains the component of the pass-through current as a bias current. That is, since the current Ipp is detected regardless of the presence or absence of an inter-row-line short defect, the method needs to determine the presence or absence of a short defect by measuring the value of current. Additionally, the pass-through current varies depending on factors such as the manufacturing condition and measuring temperature. For this reason, when a set level of a determination threshold value is excessively high, a small short defect cannot be detected. In contrast, when the set level of the determination threshold value is excessively low, the probability of erroneous determination is increased to unexpectedly determine even an inherently acceptable product to be defective. This leads to problems in measurement accuracy.

Figure 3:
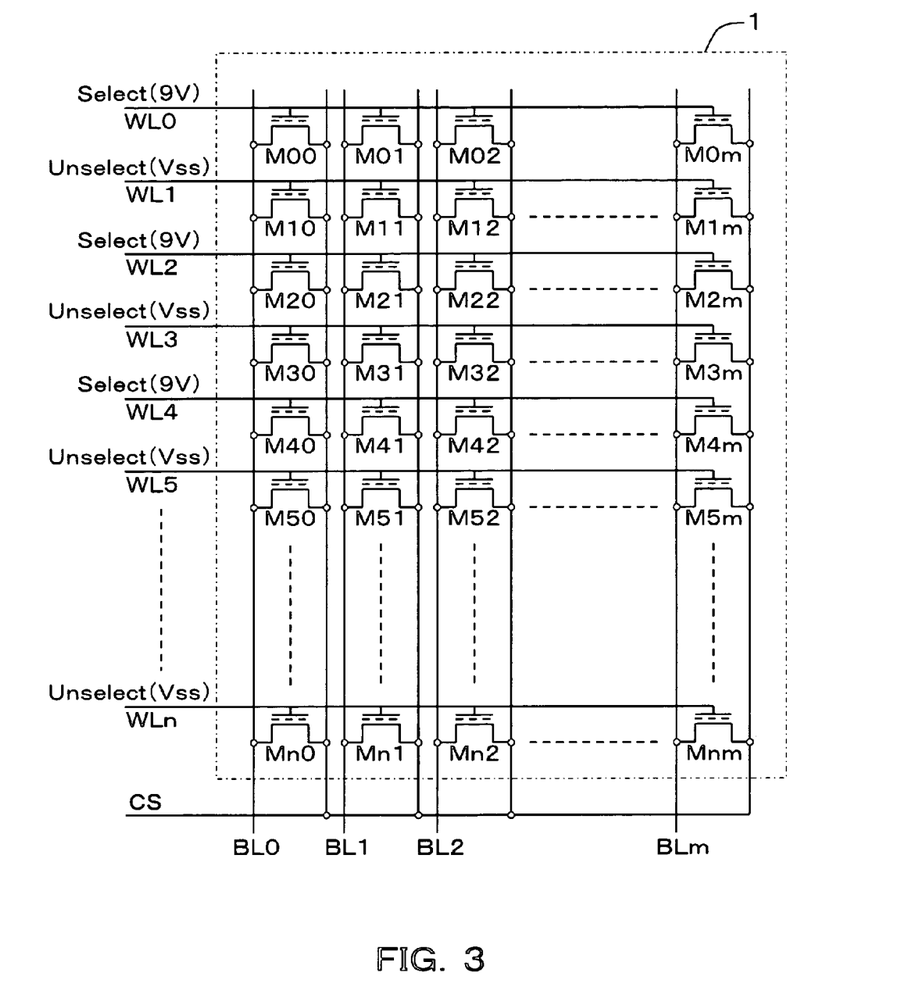
FIG. 3 is another explanatory view depicting a selected state of row lines of a memory array of the nonvolatile semiconductor storage device in a test mode.

FIG. 3 shows a memory array configuration for describing a leaky-row measurement method that is employed to reduce testing time. According to the measurement method, row lines are alternately selected to be unselected row lines or selected row lines, whereby a plurality of row lines are selected in one time to undergo the measurement. However, pass-through current, as described above, occurs in a plurality of row drivers corresponding to selected row lines, so that the pass-through current is significantly increased. This results in further deterioration in the measurement accuracy, therefore making it very difficult to reduce the testing time while maintaining measurement accuracy.

Another conventional related art is disclosed in Japanese Unexamined Patent Application Publication No. 7-192500, for example. The publication discloses a measurement method in which, when testing row lines arranged parallel to one another, the row lines are held in a floating state and are alternately set to a reference potential; and remaining other row lines are applied with a testing voltage; thereby the testing time is reduced. Even in the method, however, problems similar to those with the conventional related art described above are pending resolution for row drivers designed in consideration of high-speed accessibility.

Recently, in the field of nonvolatile semiconductor storage devices, in line with advancement in miniaturization technology, defects occurring in the stage of semiconductor manufacture are even more required to be eliminated. Concurrently, reduction in the testing time is even more required to meet requirements for one-time mass production. However, according to conventional techniques as described above, measurement errors during the measurement are increased, so that problems still remains unsolved in that defective products cannot be appropriately identified. Further, sufficient reduction in the testing time is cannot be implemented.

SUMMARY OF THE INVENTION

The invention is made in view of the problems described above. Accordingly, an object of the invention is to provide a nonvolatile semiconductor storage device that is capable of solving the problems and that has a leaky-row measuring function capable of accurately identifying a defective product even while testing time is reduced. Another object of the invention is to provide a row-line short defect detection method for detecting a row-line short defect in a nonvolatile semiconductor storage device.

To achieve the object described above, a nonvolatile semiconductor storage device comprises a memory array configured such that a plurality of nonvolatile semiconductor memory cells capable of storing one-bit information or multi-bit information are individually arranged in a row direction and a column direction, and a plurality of row lines and a plurality of column lines are arranged to select a predetermined memory cell or memory cells from the plurality of memory cells; a row decoder circuit that selects a part of the plurality of row lines and that selectively provides a selected row line with a voltage level different from that for other row lines; and a current-path isolating circuit that, in a test mode different from a normal operation mode, isolates a current path in the device into a first current path for a current flowing through the row line selected and a second current path for a current not flowing through the row line but flowing through the row decoder circuit, the current path isolated being formed for supplying a testing voltage to the selected row line from a testing voltage source.

Thus, according to the feature configuration, in the test mode, when the testing voltage is supplied to one or a plurality of the row lines selected by the row decoder, the current-path isolating circuit functions such that a short current (leakage current occurred by, for example, a short with an adjacent row line or a short with a column line) flowing through the selected row line is passed through the first current path. Concurrently, a DC current component not flowing through the row line but flowing through, for example, the row decoder for the operation of the row decoder is passed though the second current path. That is, the row-line short current and the DC current component flowing through the row decoder circuit are completely isolated from each other. As such, if an ammeter is provided in the first current path, only the row-line short current can be accurately measured independently of the isolated current component flowing through the second current path.

Consequently, when attempting to reduce testing time by increasing the number of selected row lines, the current component flowing through the second current path is not measured, so that the testing time can be reduced with high measurement accuracy being maintained.

Preferably, in addition to the feature configuration, the nonvolatile semiconductor storage device further comprises two external connecting pads each for receiving the testing voltage supplied from the testing voltage source, wherein one of the two external connecting pads corresponds to the first current path and the other one of the two external connecting pads corresponds to the second current path.

According to the feature configuration, the testing voltages can be supplied independently of each other via the two pads from the testing voltage source, thereby testing accuracy can be enhanced. In addition, when increasing the number of selected row lines in one time to reduce testing time, even while Current components flowing through row driver circuits are increased in proportion thereto, the increased currents can be supplied using the external testing voltage source. This consequently enables stable measurement of row-line short currents to be implemented.

Preferably, a rearstage section of the row decoder circuit comprises a plurality of row selection circuits that each apply a predetermined voltage in units of the row line corresponding to a select/unselect state of the row line, the plurality of row selection circuits being each formed of a driver stage and a predriver stage that drives the driver stage; the first current path is formed for the current flowing through the row line via at least one of a plurality of switching devices and a pullup device of the driver stage, the plurality of switching devices constituting a mode switch circuit that switches between the normal operation mode and the test mode; and the second current path is formed for the current flowing through the predriver stage via at least another one of plurality of switching devices.

According to the feature configuration, in the row selection circuit corresponding to the selected row line, even when a circuit-operation-dependent current component is present in the predriver stage, since the current component is isolated from the first current path for the current flowing through the row line, only a row-line short current can be detected with high accuracy. In addition, when increasing the number of selected row lines in one time to reduce testing time, even while current components flowing through row driver circuits are increased in proportion thereto, only short currents can be detected with high accuracy without being influenced by the increased currents. Consequently, testing time can be reduced with the measurement accuracy being maintained.

In addition to the individual feature configurations, it is preferable that the nonvolatile semiconductor memory cells each have a MOSFET structure and concurrently have an information storage structure capable of electrically programming and erasing information into the MOSFET structure. In this case, the invention can even be effectively applied to a small-memory-size device of a single-transistor type, such as a flash memory generally used as a mass-storage nonvolatile semiconductor storage device. That is, even for the mass-storage nonvolatile semiconductor storage device, row-line short defects can be tested with high accuracy within a reduced period of time.

In order to achieve the object of the invention, there is provided a row-line short defect detection method for detecting a row-line short defect in a nonvolatile semiconductor storage device comprising a memory array configured such that a plurality of nonvolatile semiconductor memory cells capable of storing one-bit information or multi-bit information are individually arranged in a row direction and a column direction, and a plurality of row lines and a plurality of column lines are arranged to select a predetermined memory cell or memory cells from the plurality of memory cells; and a row decoder circuit that selects a part of the plurality of row lines and that selectively provides a selected row line with a voltage level different from that for other row lines. The row-line short defect detection method comprises the step of, in a test mode different form a normal operation mode, isolating a current path in the device into a first current path for a current flowing through the row line selected and a second current path for a current not flowing through the row line but flowing through the row decoder circuit, the current path isolated being formed for supplying a testing voltage to the selected row line from a testing voltage source.

Thus, according to the feature described above, in the test mode, when the testing voltage is supplied to one or a plurality of the row lines selected by the row decoder, the current-path isolating circuit functions such that a short current (leakage current occurred by, for example, a short with an adjacent row line or a short with a column line) flowing through the selected row line is passed through the first current path. Concurrently, a DC current component not flowing through the row line but flowing through, for example, the row decoder for the operation of the row decoder is passed though the second current path. That is, the row-line short current and the DC current component are isolated from each other to be measurable by an ammeter. As such, if an ammeter is provided in the first current path, only the row-line short current can be accurately measured independently of the isolated current component flowing through the second current path.

Consequently, when attempting to reduce testing time by increasing the number of selected row lines, the current component flowing through the second current path is not measured, so that the testing time can be reduced with high measurement accuracy being maintained.

DETAILED DESCRIPTION OF THE INVENTION

Referring to the accompanying drawings, a description will be provided hereinbelow regarding an embodiment of a nonvolatile semiconductor storage of the invention and an embodiment of a row-line short defect detection method that detects a short defect in a row line of the nonvolatile semiconductor storage device. The description will be made with reference to the drawings using the same reference symbols/numerals to identify portions similar to those used for the conventional nonvolatile semiconductor storage device.

Figure 1:
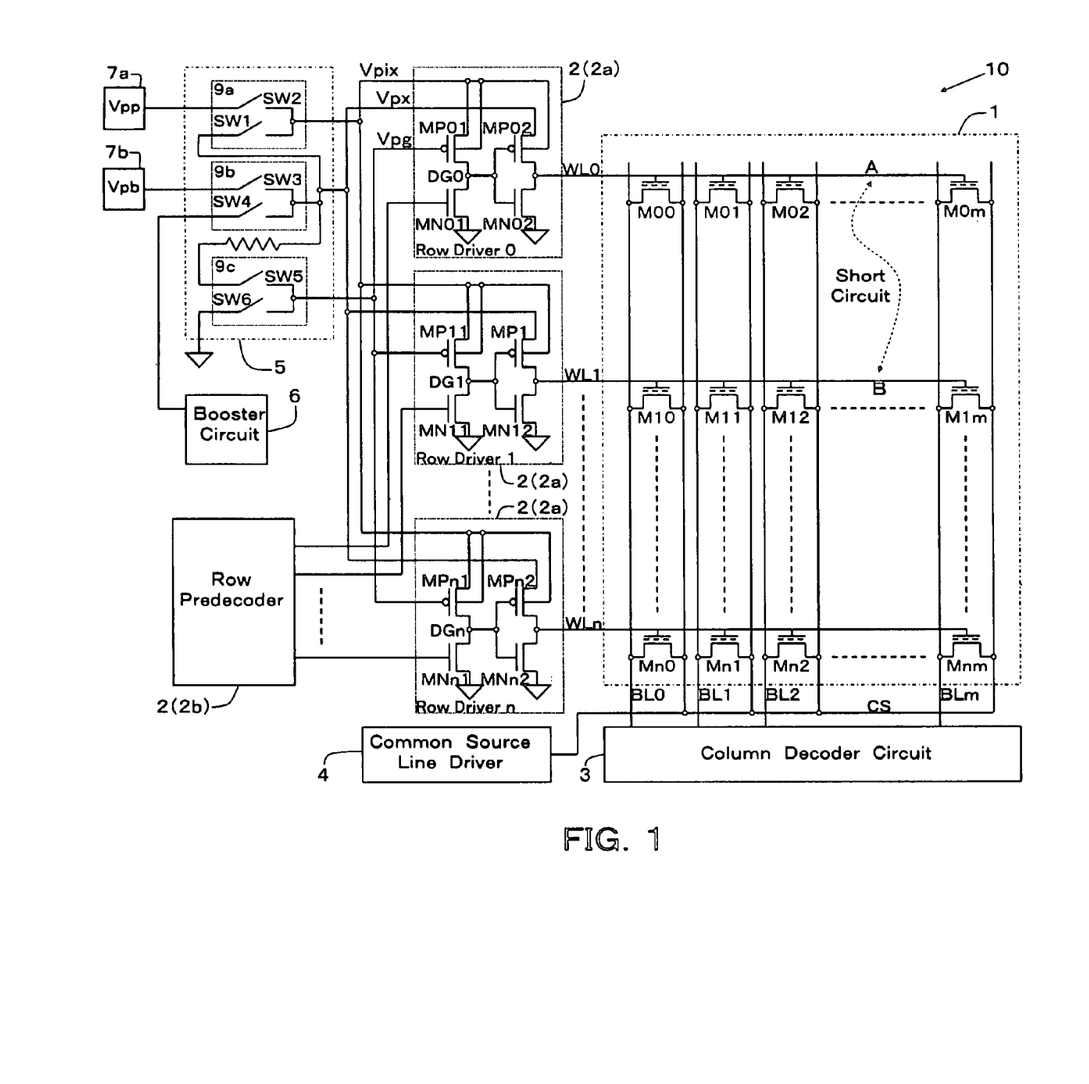
FIG. 1 is a circuit block diagram depicting an embodiment of a nonvolatile semiconductor storage device according to the invention.

Referring to FIG. 1, a nonvolatile semiconductor storage device 10 according to the invention has a memory array 1, a row decoder 2, a column decoder 3, a common source line driver 4, a mode switch circuit 5, a booster circuit 6, and two external connecting pads 7a and 7b that each receive a testing voltage supplied from a testing voltage source. In addition, similar to a general-purpose semiconductor memory, the inventive device 10 has peripheral circuits, such as an address input circuit, data input/output circuit, and a control signal input circuit. However, since the peripheral circuits are not directly related to explanation of row-line short defects (and the leaky-row measurement), the circuits are not shown in the drawing.

The configuration of the memory cell array 1 will be described hereunder. Memory cells Mij (i=0 to n; j=0 to m) each formed of a floating gate MOSFET are arranged in the vertical and transverse directions in the form of an array. In the array, a plurality of row lines WL and a plurality of column lines BL are individually arranged in the transverse direction (row direction) and the vertical direction (column direction) to be used for selection of a predetermined memory cell or memory cells from the overall memory cells. Referring to FIG. 1, the plurality of row lines WL consist of n+1 row lines WL0 to WLn and are connected to control-gates of individual memory cell transistors in the transverse direction (row direction), thereby enabling application of a predetermined voltage. In addition, in FIG. 1, the plurality of column lines BL consist of m+1 column lines BL0 to BLm and are connected to the drains of the individual memory cell transistors, thereby enabling data transfer (such as reads or programs of data) from or to the individual memory cells. The sources of the individual memory cell transistors are commonly used and hence connected to a common source line CS.

From the memory cell structure described above, a flash memory or an EEPROM, which is electrically programmable and erasable, is contemplated as the nonvolatile semiconductor storage device 10 of the present embodiment.

Meanwhile, in general, the memory array 1 is provided in one device in the form of a plurality of divided blocks; and FIG. 1 shows one the blocks.

The row decoder 2 is formed to be capable of selecting at least one of the plurality of row lines WL0 to WLn and selectively setting the selected lines to a voltage level different from that set for others not selected. Row drivers 0 to n are connected to the individual row lines WL0 to WLn to individually function as row-line select circuits that supply drive voltages to the individual row lines WL0 to WLn. In the individual row drivers 0 to n, row predecoders are provided that individually decode input signals into selection/non-selection signals in accordance with address signals (not shown). The row drivers 0 to n and the row predecoders each cooperatively form a rearstage section 2a and a forestage section 2b.

In a flash memory, which is a typical or representative nonvolatile semiconductor storage device, a high voltage of 9V, for example, is applied thereto in a row line selection mode for an operation such as a program (program operation). In the case of the nonvolatile semiconductor storage device 10, the booster circuit 6 (charge pump circuit) is built to cause intradevice charge pumping for a power supply voltage (of 3V or 5V, for example) of the storage device. The booster circuit 6 is configured such that the output voltage thereof is switchable between a normal operation mode for individual read, program, and erase operations and in a test mode.

A row driver i (i=any one of 0 to n) has a double-stage configuration with a driver stage (formed of transistors MPi2 and MNi2) and a predriver stage (formed of transistors MPi1 and MNi1). The former driver stage is used as a driver circuit that applies 9V to a row line WLi in a selection mode and that applies 0V to the row line WLi in an unselected state. The latter predriver stage drives the driver stage to accelerate access (to increase the selection/non-selection switching speed). The individual transistors MPi1 and MPi2 are p-type MOSFETs, and the individual transistors MNi1 and MNi2 are n-type MOSFETs.

The column decoder 3 is connected to the individual column lines BL0 to BLm. The column decoder 3 includes, for example, a driver and a sense amplifier. The drive is used to apply predetermined voltages to the individual column lines BL0 to BLm in individual program and erase modes. The sense amplifier is used to detect the potentials of all or a selected number of column lines at a read mode. The common source line driver 4 is configured of a driver that applies predetermined voltages to the common source line CS in the individual program, erase, and read modes.

Thus, the memory array 1, the row decoder 2, the column decoder 3, the common source line driver 4, and the booster circuit 6 are similar to those of the configuration described in the section of the related art.

The mode switch circuit 5 that switches between the normal operation mode and the test mode is responsible to switch between two modes of applying voltages to a row driver 2a selected by a corresponding row predecoder 2b. One mode is to apply the selected row driver 2a with a voltage that is output from the booster circuit 6 in the normal operation mode. The other mode is to apply the selected row driver 2a with testing voltages (Vpp and Vpb) that are output from the external connecting pads 7a and 7b in a test mode. In the embodiment, the mode switch circuit 5 is configured of three types of input selection circuits 9a to 9c, each of which is of a two-input/one-output type. The input selection circuits 9a to 9c are each configured of a pair of switching devices. In this configuration, a voltage applied by a mode switch signal to one of the two input terminals is supplied to the output terminal. In addition, in the configuration, the voltage to be applied to the two input terminals can be divided to supply an intermediate voltage to the output terminal.

The first input selection circuit 9a is responsible to switch the supply source of a voltage Vpix (the well (backgate) voltage of the transistor MPi2 of the driver stage, and a well (backgate) voltage of the transistor MPi1 of the predriver stage) between the normal operation mode and the test mode. The second input selection circuit 9b is responsible to switch the supply source of a voltage Vpx (the source voltage of the transistor MPi2) between the normal operation mode and the test mode. The third input selection circuit 9c is responsible to switch the supply source of a voltage Vpg (the gate voltage of the transistor MPi1 of the predriver stage) between the normal operation mode and the test mode.

In more detail, as shown in FIG. 1, in the first input selection circuit 9a, two input terminals are individually connected to the output terminal (voltage Vpx) of the second input selection circuit 9b and to a testing voltage Vpp of the external connecting pad 7a, whereby one of the two voltages is selected to be the voltage Vpix. In the second input selection circuit 9b, two input terminals are individually connected to the output terminal of the booster circuit 6 and to a testing voltage Vpb of the external connecting pad 7b, whereby one of the two voltages is selected to be the voltage Vpx. In the third input selection circuit 9c, two input terminals are individually connected to the output terminal (voltage Vpx) of the second input selection circuit 9b and to the ground potential (Vss). However, the third input selection circuit 9c does not perform the simple operation of switching the voltage supply source between the normal operation mode and the test mode, but also performs the following operations. In the normal operation mode, the circuit 9c sets both the switching devices to the conductive state to enable the transistor MPi1 to be concurrently used as a pullup resistant component. Where, the voltage Vpg, which is lower than the voltage Vpx, is generated through resistance-type potential division, and an output node DGi of the predriver stage is boosted to the high voltage of 9 V through the pullup resistant component. In the test mode, the circuit 9c fixes the voltage Vpg to the ground potential.

The individual switching devices SW1 to SW6 of the individual input selection circuits 9a to 9c are operated as described hereunder. In the normal operation mode, switching devices SW1, SW4, SW5, and SW6 are set to the conductive state, and switching devices SW2 and SW3 are set to the nonconductive state. In the test mode, the switching devices SW2, SW3, and SW6 are set to the conductive state, and the switching devices SW1, SW4, and SW5 are set to the nonconductive state. In line with these switching operations, in the normal operation mode, the voltage Vpix and the voltage Vpx are supplied with predetermined voltages, which are generated by the booster circuit 6, corresponding the read mode, program mode, and erase mode. In the test mode, the testing voltage Vpp is supplied as the voltage Vpix from the external connecting pad 7a, the testing voltage Vpb is supplied as the voltage Vpx from the external connecting pad 7b, and the voltage Vpg is fixed to the ground potential (Vss). In the test mode, the switching device SW5 is set to the nonconductive state, thereby a DC current path formed from the voltage Vpx to the ground potential via the third input selection circuit 9c is cut "off."

As such, the DC current path formed from the voltage to the ground potential is used as a current path (first current path) via the row line.

A detection method for the presence or absence of a leakage current between adjacent row lines will be described hereinbelow. In this method, a leakage current detected between adjacent row lines indicates occurrence of a short defect. In the test mode, the common source line CS and the individual column lines BL0 to BLm are grounded. Then, as described above, the mode switch circuit 5 sets the switching devices SW2, SW3, and SW6 to the conductive state, and sets the switching device SW1, SW4, and SW5 to the nonconductive state.

As shown in FIG. 2, one row line (WL0) is selected from all the row lines WL0 to WLn of the memory array 1, and the high voltage Vpp (9V, for example) and the testing voltage Vpb (9V, for example) are applied from the external connecting pads 7a and 7b, respectively. In this case, the testing voltage Vpp is supplied as the voltage Vpix, and the testing voltage Vpb is supplied as the voltage Vpx.

Description will now be made assuming the case where the row line WL0 is selected (which is equivalent to the case shown in FIG. 2). For a row decoder 0 of the selected row line, a selection signal from the row predecoder 2b turns on a transistor MN01 of the predriver stage. Thereby, a gate voltage DG0 of the driver stage is set to a Vss level, and the voltage Vpx (9V) is supplied to the row line WL0.

The row lines other than the row line WL0 are in the unselected state, so that the selection signal is not output from the row predecoder 2b (that is, the voltage is held at the Vss level), and hence individual transistors MN11 to MNn1 of the individual row decoders are not turned on. As such, the voltage Vpix (9V) is applied to the individual driver-stage gates DG1 to DGn of the individual driver stages through transistor MP11 to MPn1 of the predriver stages, thereby setting the individual row lines WL1 to WLn to the Vss level. In this case, the voltage to be applied to the gates of p-type transistors MP01 to MPn1 of all the predriver stages are held in the voltage Vpg (Vss level).

Description hereinbelow will now be made assuming that an inter-row-line short defect has occurred between a node A on the selected row line WL0 and a node B on the adjacent row line WL1, as shown in FIG. 1.

The voltage Vpx (=testing voltage Vpb), which is supplied to the row line WL0 from the external connecting pad 7b, is applied to the row line WL0 via the current path (external connecting pad 7b—switching device SW3—transistor MP02) and then to the row line WL1 via the inter-row-line short portions A and B. At this time, since the row line WL1 is in the unselected state, Vss (ground potential) is being applied thereto. As such, when a short portion is present in the adjacent row line, a short current Ipb flows from the external connecting pad 7b to Vss. When a short is not occurred (absent) between the row lines, the short current Ipb does not flow. As such, monitoring of the short current Ipb enables row-line short defects to be tested.

In contrast, in the predriver stage of the row decoder 0 of the selected row line WL0, since both the transistors MP01 and MN01 are in the on-state, a DC pass-through current is kept flowing thereto.

However, the voltage Vpix, which is the source voltage of the transistor MP01, is the testing voltage Vpp supplied from the external connecting pad 7a, which is different from the external connecting pad 7b that supplies the voltage Vpx (=testing voltage Vpb) to the row line. The current path for the pass-through current is an isolated current path (a second current path) from the current path (the first current path).

This enables a net leakage current flowing through the inter-row-line short portion to be accurately measured in the state that the component of the pass-through current is isolated from a current component detected in the first current path. Consequently, an inter-row line leakage current can be detected with high accuracy without being influenced by pass-through current variations caused by factors such as manufacture condition and peripheral temperature during testing stages, for example.

In the test mode, the first current path, which is a leakage current path formed by a row-line short defect, and the second current path for the current not flowing through the row line but flowing through a row decoder circuit (which, in the present embodiment, corresponds to a row-line selection circuit in the rearstage thereof) are completely isolated from the external connecting pads 7a and 7b via the input selection circuits 9a and 9b constituting the mode switch circuit 5. Thus, the mode switch circuit 5 especially with the first input selection circuit 9a and 9b included therein functions as a current-path isolating circuit that isolates the first current path and second current path from each other.

As shown in FIG. 3, the leaky-row test is also performed by selecting a plurality of row lines. In consideration of the nature of the measurement, the measurement is carried out in the manner that row lines not adjacent to each other are selected, and the remaining row lines are set to the Vss level. In more detail, as shown in FIG. 3, odd-numbered row lines, for example, are selected, and the even-numbered row lines are not selected. In this case, when no short defect (leakage current) is present in the odd-numbered row lines, the odd/even states are reversed, and similar measurement is carried out by selecting the remaining even-numbered row lines. If an inter-row-line short defect is detected, the odd/even states need not be reversed. However, when attempting to synchronously detect a row-line short defect and a short defect in a portion other than an inter-row-line portion, such as a portion to a column line, all the row lines are selected once before completion of the measurement.

In the measurement described above, since the current flowing to the overall device is greater than the current in the case of selecting only one row line, so that measurement with relatively higher accuracy is required. However, according to the invention, even when the transistors of the predriver stage of the row-line selecting circuit are driven to the on-state, and the pass-through current is thereby occurred, the current flows through the isolated current path (second current path). Thereby, the presence or absence of a leakage current can be accurately detected. Consequently, testing time can be reduced by implementing the testing method of the embodiment in which the plurality of row lines are selected.

Thus, according to the invention, when the testing voltage is supplied to one or a plurality of the row lines selected by the row decoder 2, the current-path isolating circuit functions such that a short current (leakage current occurred by, for example, a short with an adjacent row line or a short with a column line) flowing through the selected row line is passed through the first current path. Concurrently, the DC current component not flowing through the row line but flowing through, for example, the row decoder for the operation of the row decoder 2 is passed though the second current path. That is, the row-line short current and the DC current component flowing through the row decoder circuit are completely isolated from each other. As such, only the row-line short current can be accurately measured independently of the isolated current component flowing through the second current path. Consequently, when attempting to reduce testing time by increasing the number of selected row lines, the current component flowing through the second current path is not measured, so that the testing time can be reduced with high measurement accuracy being maintained.

As above, the embodiment has been described by contemplating a flash memory or an EEPROM, which is electrically programmable and erasable, as the nonvolatile semiconductor storage device. However, the nonvolatile semiconductor storage device is not limited thereto, but any type of nonvolatile semiconductor storage devices may be used for the application of the invention.

The invention can be effectively applied not only to nonvolatile semiconductor storage devices, but also to any type of semiconductor storage devices. Especially, the invention can be effectively used when a circuit-operation dependent DC current path is occurred in the test mode in a row selection circuit provided to apply a driving voltage to individual row lines and when the row selection circuit handles a plurality of voltage levels.

In addition, the embodiment has been described with reference to the case where the circuit-operation dependent DC current path (second current path) occurs in the test mode in the row selection circuit exemplified in FIG. 1. However, in the event that a second current path of the described type is formed in a circuit different from the row selection circuit or even when second current paths of the described type are formed in the row selection circuit as well as a circuit different therefrom, the event can be handled in a manner similar to that described above. Meanwhile, the row selection circuit is not limited to that exemplified in FIG. 1.

The circuit configuration of the mode switch circuit 5, which functions as the current-path isolating circuit, is not necessarily limited to the circuit configuration of the present embodiment.

The embodiment has the configuration formed by contemplating the case of supplying the voltage from the booster circuit 6 for all the read, program, and erase operations in the normal operation mode. However, the configuration may be such that the booster circuit 6 is used only for partial operations of the read, program, and erase operations; and the power is directly supplied from a power-supply terminal for the other operations or is supplied via a different booster circuit therefor.

The embodiment uses the external connecting pads 7a and 7b used as test-dedicated pads in the test mode. However, the embodiment may be such that the pads are commonly used for, for example, input pads or input/output pads in the normal operation mode.

The row-line short defect detection method of the invention for detecting row-line short defects is not specifically limited to the use for pre-assembly wafer-stage testing or post-assembly package stage testing. The method may be used for testing in any stage of the manufacture.

Although the present invention has been described in terms of the preferred embodiment, it will be appreciated that various modifications and alterations might be made by those skilled in the art without departing from the spirit and scope of the invention. The invention should therefore be measured in terms of the claims which follow.

What is claimed is:

1. A nonvolatile semiconductor storage device comprising:
    a memory array configured such that a plurality of nonvolatile semiconductor memory cells capable of storing one-bit information or multi-bit information are individually arranged in a row direction and a column direction, and a plurality of row lines and a plurality of column lines are arranged to select a predetermined memory cell or memory cells from the plurality of memory cells;

a row decoder circuit that selects a part of the plurality of row lines and that selectively provides a selected row line with a voltage level different from that for other row lines; and a current-path isolating circuit that, in a test mode different from a normal operation mode, isolates a current path in the device into a first current path for a current flowing through the row line selected and a second current path for a current not flowing through the row line but flowing through the row decoder circuit, the current path isolated being formed for supplying a testing voltage to the selected row line from a testing voltage source.

2. The nonvolatile semiconductor storage device according to claim 1, further comprising two external connecting pads each for receiving the testing voltage supplied from the testing voltage source, wherein one of the two external connecting pads corresponds to the first current path and the other one of the two external connecting pads corresponds to the second current path.

3. The nonvolatile semiconductor storage device according to claim 1, wherein:

a rearstage section of the row decoder circuit comprises a plurality of row selection circuits that each apply a predetermined voltage in units of the row line corresponding to a select/unselect state of the row line, the plurality of row selection circuits being each formed of a driver stage and a predriver stage that drives the driver stage;

the first current path is formed for the current flowing through the row line via at least one of a plurality of switching devices and a pullup device of the driver stage, the plurality of switching devices constituting a mode switch circuit that switches between the normal operation mode and the test mode; and the second current path is formed for the current flowing through the predriver stage via at least another one of plurality of switching devices.

4. The nonvolatile semiconductor storage device according to claim 1, wherein the nonvolatile semiconductor memory cells each have a MOSFET structure and concurrently have an information storage structure capable of electrically programming and erasing information into the MOSFET structure.

5. A row-line short defect detection method for detecting a row-line short defect in a nonvolatile semiconductor storage device comprising:

a memory array configured such that a plurality of nonvolatile semiconductor memory cells capable of storing one-bit information or multi-bit information are individually arranged in a row direction and a column direction, and a plurality of row lines and a plurality of column lines are arranged to select a predetermined memory cell or memory cells from the plurality of memory cells; and a row decoder circuit that selects a part of the plurality of row lines and that selectively provides a selected row line with a voltage level different from that for other row lines, the row-line short defect detection method comprising the step of, in a test mode different from a normal operation mode, isolating a current path in the device into a first current path for a current flowing through the row line selected and a second current path for a current not flowing through the row line but flowing through the row decoder circuit, the current path isolated being formed for supplying a testing voltage to the selected row line from a testing voltage source.

6. The row-line short defect detection method according to claim 5, wherein, in the step of isolating, the testing voltage is isolated into two testing voltages to be supplied from a testing voltage source to two external connecting pads and supplied from the testing voltage source, wherein one of the two external connecting pads corresponds to the first current path and the other one of the two external connecting pads corresponds to the second current path.

7. The row-line short defect detection method according to claim 5, wherein a rearstage section of the row decoder circuit comprises a plurality of row selection circuits that each apply a predetermined voltage in units of the row line corresponding to a select/unselect state of the row line, the plurality of row selection circuits being each formed of a driver stage and a predriver stage that drives the driver stage, wherein, in the step of isolating:

the first current path is formed for the current flowing through the row line via at least one of a plurality of switching devices and a pullup device of the driver stage, the plurality of switching devices constituting a mode switch circuit that switches between the normal operation mode and the test mode; and the second current path is formed for the current flowing through the predriver stage via at least another one of plurality of switching devices.

8. The row-line short defect detection method according to claim 5, wherein the semiconductor memory cells each have a MOSFET structure and concurrently have an information storage structure capable of electrically programming and erasing information into the MOSFET structure.

* * * * *